(12) United States Patent
Sippel et al.

(10) Patent No.: US 10,954,809 B2
(45) Date of Patent: Mar. 23, 2021

(54) CERAMIC MATRIX FULL HOOP BLADE TRACK

(71) Applicants: Rolls-Royce Corporation, Indianapolis, IN (US); Rolls-Royce North American Technologies Inc., Indianapolis, IN (US); Rolls-Royce High Temperature Composites Inc., Cypress, CA (US)

(72) Inventors: Aaron D. Sippel, Zionsville, IN (US); Bruce E. Varney, Greenwood, IN (US); Ted J. Freeman, Danville, IN (US); Christopher Barrett, Huntington Beach, CA (US)

(73) Assignees: Rolls-Royce High Temperature Composites Inc., Cypress, CA (US); Rolls-Royce Corporation, Indianapolis, IN (US); Rolls-Royce North American Technologies Inc., Indianapolis, IN (US)

( * ) Notice: Subject to any disclaimer, the term of this patent is extended or adjusted under 35 U.S.C. 154(b) by 203 days.

(21) Appl. No.: 15/989,666

(22) Filed: May 25, 2018

(65) Prior Publication Data
US 2018/0371930 A1    Dec. 27, 2018

Related U.S. Application Data

(60) Provisional application No. 62/524,859, filed on Jun. 26, 2017.

(51) Int. Cl.
*F01D 11/08* (2006.01)
*F01D 25/00* (2006.01)
(Continued)

(52) U.S. Cl.
CPC ............ *F01D 11/08* (2013.01); *B23P 15/006* (2013.01); *C23C 16/045* (2013.01);
(Continued)

(58) Field of Classification Search
CPC ........ F01D 11/08; F01D 11/12; F01D 11/122; F01D 11/125; F01D 11/127; F01D 25/005; F01D 25/246; F05D 2240/11; F05D 2260/36; F05D 2300/6012; F05D 2300/6033; B23P 15/006; C23C 16/045;
(Continued)

(56) References Cited

U.S. PATENT DOCUMENTS

| 6,705,832 B2 * | 3/2004 | Tiemann .................. F01D 5/22 277/630 |
| 8,235,670 B2 | 8/2012 | Morrison et al. |

(Continued)

FOREIGN PATENT DOCUMENTS

FR    2980235 B1    9/2011

OTHER PUBLICATIONS

Department of Energy Report (DOE/CE/41000-3)—Melt Infiltrated Ceramic Composites for Gas Turbine Engine Applications (Phase II Final Report).

*Primary Examiner* — Christopher Verdier
(74) *Attorney, Agent, or Firm* — Barnes & Thornburg LLP

(57) ABSTRACT

A gas turbine engine may comprise a blade track and a method of making the same. The blade track may be constructed of ceramic matrix composite components including main body members and joints.

15 Claims, 3 Drawing Sheets

(51) Int. Cl.
*F01D 25/24* (2006.01)
*B23P 15/00* (2006.01)
*C23C 16/32* (2006.01)
*C23C 16/04* (2006.01)

(52) U.S. Cl.
CPC .......... *C23C 16/325* (2013.01); *F01D 25/005* (2013.01); *F01D 25/246* (2013.01); *F05D 2220/32* (2013.01); *F05D 2240/11* (2013.01); *F05D 2260/36* (2013.01); *F05D 2300/6012* (2013.01); *F05D 2300/6033* (2013.01); *Y10T 29/4932* (2015.01); *Y10T 29/49321* (2015.01); *Y10T 29/49801* (2015.01); *Y10T 29/49936* (2015.01)

(58) Field of Classification Search
CPC ............... C23C 16/325; Y10T 29/4932; Y10T 29/49321; Y10T 29/49801; Y10T 29/49936
USPC .......................................... 427/249.2, 255.12
See application file for complete search history.

(56) References Cited

U.S. PATENT DOCUMENTS

| | | |
|---|---|---|
| 8,753,073 B2 | 6/2014 | Albers et al. |
| 2011/0056055 A1* | 3/2011 | Gendraud ............. F01D 25/246 24/457 |
| 2014/0272274 A1 | 9/2014 | Lazur |
| 2015/0377035 A1* | 12/2015 | Freeman ................. F01D 11/12 416/191 |
| 2016/0123171 A1 | 5/2016 | Westphal et al. |
| 2016/0319682 A1 | 11/2016 | Sippel et al. |
| 2016/0319688 A1 | 11/2016 | Vetters et al. |
| 2016/0319689 A1 | 11/2016 | Vetters et al. |
| 2016/0368827 A1 | 12/2016 | Landwehr et al. |
| 2019/0242268 A1 | 8/2019 | Vetters et al. |
| 2020/0056493 A1 | 2/2020 | Sippel et al. |

* cited by examiner

CERAMIC MATRIX FULL HOOP BLADE TRACK

CROSS REFERENCE TO RELATED APPLICATIONS

This application claims priority to and the benefit of U.S. Provisional Patent Application No. 62/524,859, filed 26 Jun. 2017, the disclosure of which is now expressly incorporated herein by reference.

FIELD OF THE DISCLOSURE

The present disclosure relates generally to gas turbine engines, and more specifically to components for gas turbine engines made from ceramic matrix composite materials.

BACKGROUND

Gas turbine engines are used to power aircraft, watercraft, power generators, and the like. Gas turbine engines typically include a compressor, a combustor, and a turbine. The compressor compresses air drawn into the engine and delivers high pressure air to the combustor. In the combustor, fuel is mixed with the high pressure air and is ignited. Products of the combustion reaction in the combustor are directed into the turbine where work is extracted to drive the compressor and, sometimes, an output shaft. Left-over products of the combustion are exhausted out of the turbine and may provide thrust in some applications.

Compressors and turbines typically include alternating stages of static vane assemblies and rotating wheel assemblies that perform work on or extract work from gasses moving through a primary gas path of the engine. The rotating wheel assemblies include disks carrying blades around their outer edges. When the rotating wheel assemblies turn, tips of the blades move along blade tracks that are arranged around the rotating wheel assemblies. Such blade tracks are adapted to reduce the leakage of gas over the blades without interaction with the blades. The blade tracks may also be designed to minimize leakage of gas into or out of the primary gas path. Design and manufacture of such blade tracks from composite material, such as ceramic-matrix composites, can present challenges.

SUMMARY

The present disclosure may comprise one or more of the following features and combinations thereof.

A full hoop blade track or other assembly for a gas turbine engine is disclosed. The blade track may include a first segment comprising ceramic-matrix composite materials, a second segment comprising ceramic-matrix composite materials, and a joint. The first segment may include a band or body shaped to extend part-way around a central axis and an attachment tongue that extends about the central axis from a circumferential end of the band. The second segment may similarly include a band or body shaped to extend part-way around the central axis and an attachment tongue that extends about the central axis from a circumferential end of the band. The joint may couple the first segment to the second segment.

In illustrative embodiments, the joint may include a tube of reinforcement fibers that receives the attachment tongues of the first segment and the second segment. The tube of reinforcement fibers may further be co-infiltrated with ceramic-containing matrix material along with the first segment and the second segment in order to couple the first segment to the second segment. In some embodiments, the tube of reinforcement fibers may be woven or braided such that the tube of reinforcement fibers lacks a seam that extends circumferentially along the blade track.

A method of making a full hoop blade track or other assembly for a gas turbine engine is also disclosed. The method may include chemical vapor infiltrating ceramic material preforms with silicon-carbide fibers. The preforms may include a first blade track segment having a first band and a first tongue, a second blade track segment having a second band and a second tongue, and a joint having a tube of reinforcement fibers.

In illustrative embodiments, the method may include assembling the full hoop blade track by inserting the first tongue formed on the first segment into a first end of the tube of reinforcement fibers and inserting the second tongue formed on the second segment into a second end of the tube of reinforcement fibers. The method may in some embodiments include slurry infiltrating and melt infiltrating the first segment, the second segment, and the joint to bond the first segment, the second segment, and the joint together so that each of the first segment, the second segment, and the joint each form a portion of a radially-inward facing surface of the full hoop blade track.

According to another aspect of the present disclosure, a second full hoop blade track or other assembly for a gas turbine engine is disclosed. The blade track or assembly may include an inner layer comprising ceramic-matrix composite materials and an outer layer comprising ceramic-matrix composite materials. The inner layer may include a first strip shaped to extend part-way around a central axis and a second strip shaped to extend part-way around the central axis. The outer layer may include a first strip shaped to extend part-way around a central axis and a second strip shaped to extend part-way around the central axis.

In illustrative embodiments, the inner layer and the outer layer are arranged so that joints between strips included in the inner layer and the outer layer are offset in the circumferential direction relative to the central axis. The first and second strips of the inner layer may form a butt joint and the first and second strips of the outer layer may form a butt joint. The butt joint formed by the first and second strips of the inner layer may be offset from the butt joint formed by the first and second strips of the outer layer in the circumferential direction.

These and other features of the present disclosure will become more apparent from the following description of the illustrative embodiments.

DETAILED DESCRIPTION OF THE DRAWINGS

Figure 1:
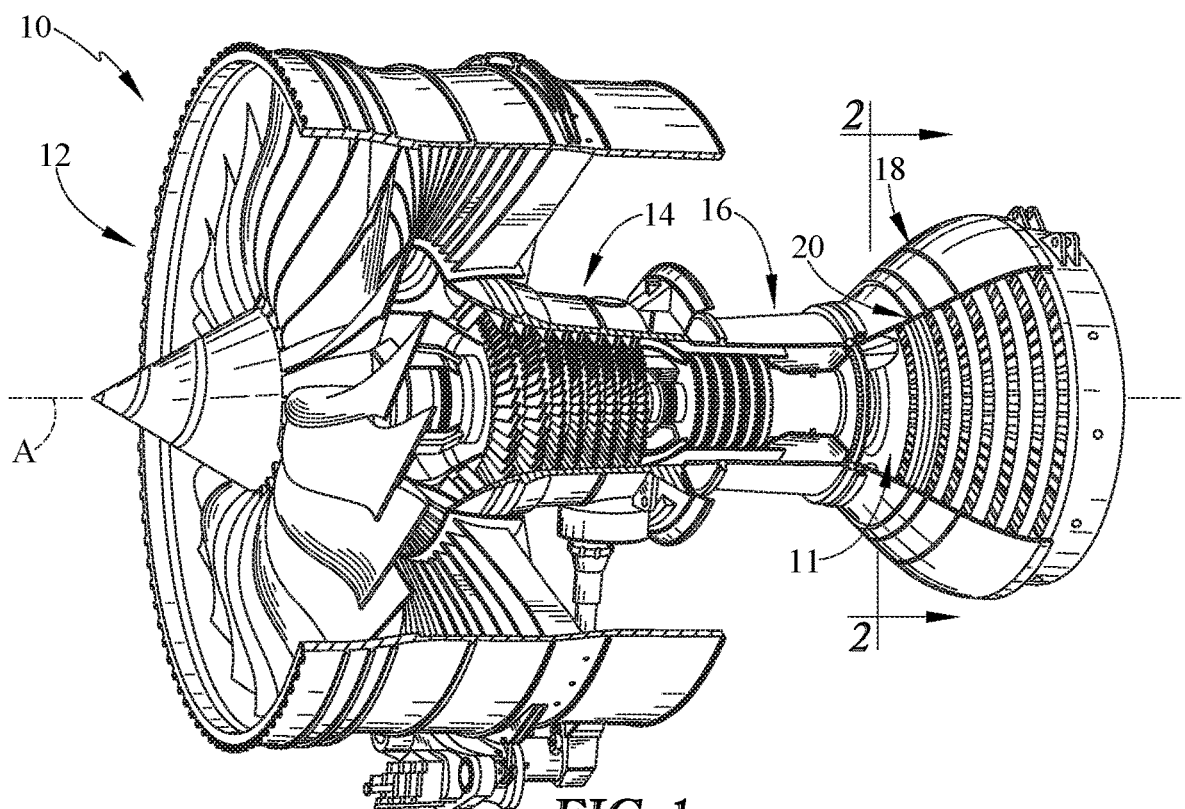
FIG. 1 is a cut-away perspective view of a gas turbine engine showing that the exemplary engine includes a fan driven by an engine core having a compressor, a combustor, and a turbine including a blade track further illustrated in FIG. 2.

For the purposes of promoting an understanding of the principles of the disclosure, reference will now be made to a number of illustrative embodiments illustrated in the drawings and specific language will be used to describe the same.

An illustrative aerospace gas turbine engine 10 includes a fan 12, a compressor 14, a combustor 16, and a turbine 18 as shown in FIG. 1. The fan 12 is driven by the turbine 18 and provides thrust for propelling an air vehicle. The compressor 14 compresses and delivers air to the combustor 16. The combustor 16 mixes fuel with the compressed air received from the compressor 14 and ignites the fuel. The hot, high-pressure products of the combustion reaction in the combustor 16 are directed into the turbine 18 to cause the turbine 18 to rotate about a central axis A and drive the compressor 14 and the fan 12.

Figure 2:
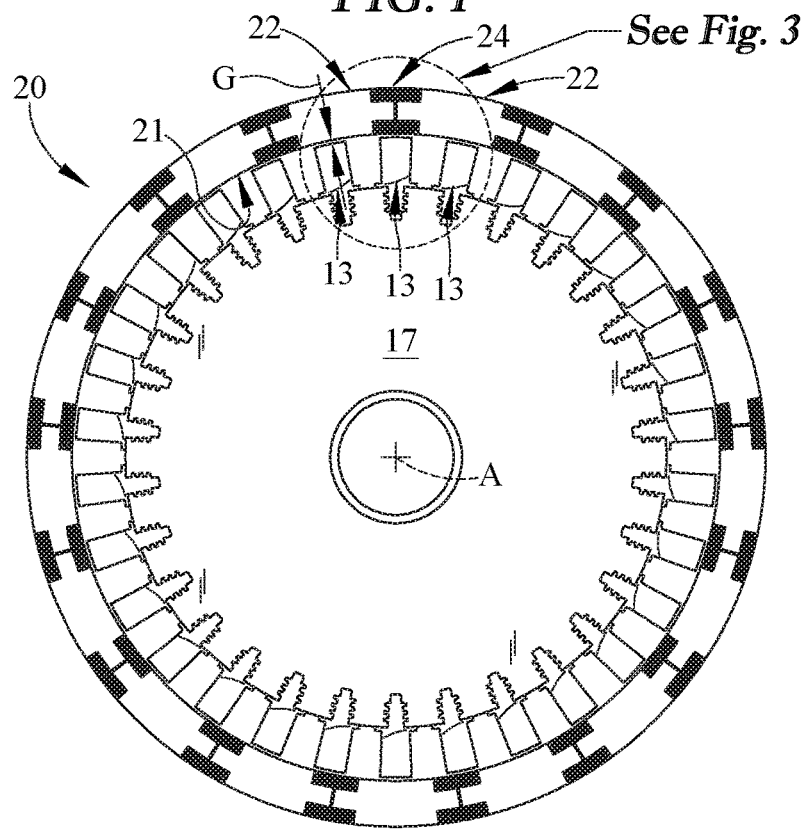
FIG. 2 is a cross sectional view of the turbine showing that the blade track includes a plurality of blade track segments connected to one another via joints and showing that the plurality of blade track segments and joints form a full hoop blade track extending circumferentially around the turbine.

The turbine 18 includes at least one turbine wheel assembly 11 and a blade track 20 positioned to surround the turbine wheel assembly 11 as shown in FIGS. 1 and 2. The turbine wheel assembly 11 includes a plurality of blades 13 coupled to a rotor disk for rotation therewith. The hot, high pressure combustion products from the combustor 16 are directed toward the blades 13 of the turbine wheel assembly 11 along a flow path 17. The blades 13 are in turn pushed by the combustion products to cause the turbine wheel assembly 11 to rotate; thereby, driving the rotating components of the compressor 14 and/or the fan 12.

Blade track 20 extends around the turbine wheel assembly 11 to block combustion products from passing over the blades 13 through a gap G without pushing the blades 13 to rotate as suggested in FIG. 2. Blade track 20 is made from ceramic matrix composite materials, such as, for example silicon-carbide fibers suspended in a silicon-carbide matrix. However, any suitable ceramic composition may be used depending on application.

Blade track 20 comprises a plurality of blade track segments 22 and a plurality of joints 24 as shown in FIG. 2. Blade track segments 22 are arcuate and are formed to extend circumferentially around the central axis A and are integrated with one another via matrix material so as to form a full-hoop. Joints 24 are formed to receive at least a portion of adjacent blade track segments 22 to couple blade track segments 22 together and form a full-hoop blade track 20.

Figure 3:
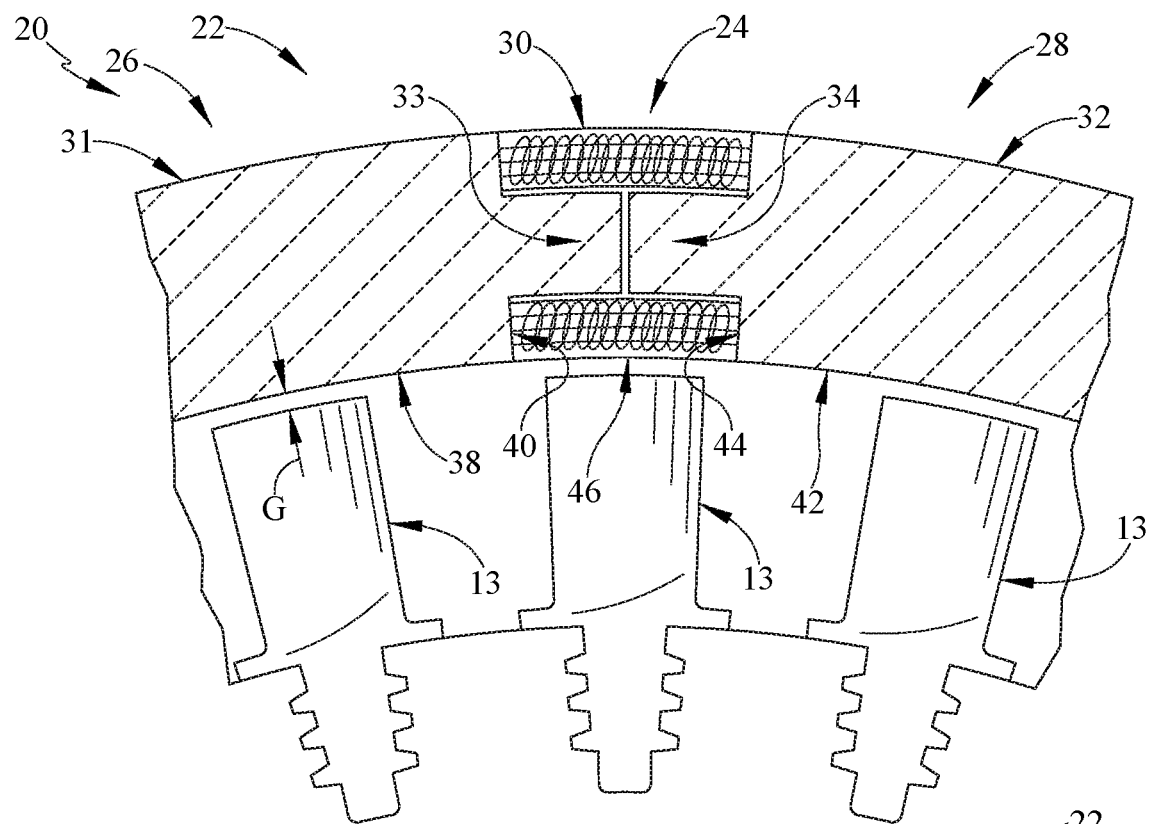
FIG. 3 is an enlarged sectional view of a portion of FIG. 2 showing that each blade track segment includes a blade track portion and a tongue and showing that the tongue extends circumferentially from the blade track portion and into the joint.

As shown in FIG. 3, blade track 20 comprises a first segment 26, a second segment 28, and a joint 30. First segment 26 and second segment 28 are made from ceramic matrix composite materials and are shaped to extend part way around central axis A. Joint 30 is arranged between first segment 26 and second segment 28 and couples first segment 26 to second segment 28 to form blade track 20.

First segment 26 and second segment 28 include bands 31, 32 and tongues 33, 34 as shown in FIG. 3. Bands 31, 32, sometimes called main bodies, extend part way around central axis A and interface with turbine blades 13. Tongues 33, 34 extend circumferentially from bands 31, 32 towards one another. Tongues 33, 34 are received by joint 30 to couple first segment 26 to second segment 28.

Figure 4:
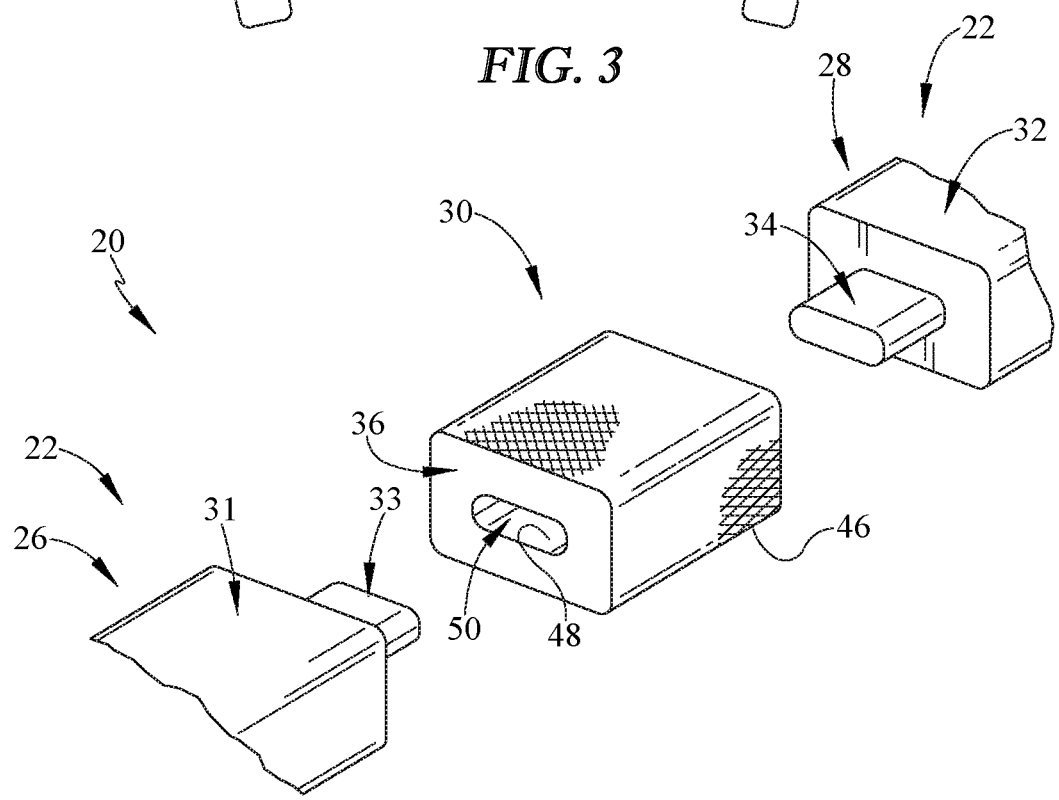
FIG. 4 is an enlarged perspective view of the blade track segments and the joint from FIG. 3 and showing that the joint is formed from a ceramic-containing matrix material including a tube of reinforcement fibers that are woven or braided together so as to lack a seam.

Joint 30 includes a tube of reinforcement fibers 36 as shown in FIG. 4. The tube of reinforcement fibers 36 is woven or braided such that the tube of reinforcement fibers 36 lacks a seam that extends circumferentially along the blade track. The tube of reinforcement fibers 36 has a circumferential cross sectional area that is larger than a circumferential cross sectional area of tongues 33, 34 and tongues 33, 34 extend into joint 30.

Band or main body 31 of the first segment 26 includes a radially-inner surface 38 and an attachment surface 40 as shown in FIGS. 3 and 4. Radially-inner surface 38 faces flow path 17 and interfaces with blades 13 to minimize the gap G between the blades 13 and the blade track 20. Tongue 33 extends circumferentially from attachment surface 40. Attachment surface 40 faces joint 30 when tongue 33 is received within the tube of reinforcement 36.

Band or main body 32 of the second segment 28 includes a radially-inner surface 42 and an attachment surface 44 as shown in FIGS. 3 and 4. Radially-inner surface 42 faces flow path 17 and interfaces with blades 13 to minimize the gap G between the blades 13 and the blade track 20. Tongue 34 extends circumferentially from attachment surface 44. Attachment surface 44 faces joint 30 when tongue 34 is received within the tube of reinforcement 36.

The tube of reinforcement fibers 36 includes a radially inner surface 46 and an interior tube surface 48 as shown in FIGS. 3 and 4. Radially inner surface 46 faces flow path 17 and interfaces with blades 13 to minimize the gap G between the blades 13 and the blade track 20. Radially inner surface 46 is illustratively coextensive or flush with radially inner surfaces 38, 42 of bands 31, 32. Tube surface 48 defines a joint cavity 50. Tongues 33, 34 are shaped to extend into joint cavity 50 to form blade track 20 and align radially inner surfaces 38, 42, and 46 of bands 31, 32 and the tube of reinforcement fibers 36.

Another aspect of the present disclosure involves a method of making a full hoop blade track 20. Illustratively, first segment 26, second segment 28, and joint 30 may be ceramic matrix preforms. The ceramic matrix preforms are chemical vapor infiltrated with matrix material to preliminarily fix the shape of the components.

Tongues 33, 34 of first segment 26 and second segment 28 are inserted into joint cavity 50 of the tube of reinforcement fibers 36 to provide a pre-assembly full hoop blade track 20. Radially inner surfaces 38, 42, and 46 of bands 31, 32 and the tube of reinforcement fibers 36 are aligned so as to be coextensive or flush with one another. A fixture may be used to hold the pre-assembly in place.

The pre-assembly full hoop blade track 20 is then melt infiltrated with additional matrix material so that each of the first segment 26, second segment 28, joint 30 are joined together. Melt infiltrating blade track 20 provides a continuous inwardly facing surface 21 of the full hoop blade track 20 as shown in FIG. 2.

Illustratively, the tube of reinforcement fibers 36 may be a wrap laminate or a rolled sheet, sometimes called a jelly-roll, that is wrapped to form the tube of reinforcement fibers 36. In other embodiments, the tube of reinforcement fibers is a three-dimensionally woven or braided ceramic matrix lacking a seam, such as, for example, a silicon-carbide matrix.

Chemical vapor infiltration may be used to infiltrate the ceramic matrix preforms with silicon-carbide fibers to produce ceramic matrix composite components. Any suitable ceramic matrix material and ceramic-containing fibers may be used depending on application. First segment 26, second segment 28, and joint 30 are then melt infiltrated to densify the components and bond them together. The components may be slurry infiltrated to form ceramic matrix composite materials.

Illustratively, first segment 26, second segment 28, and joint 30 may be used in a number of gas turbine engine assemblies. For example, in addition to blade tracks, full hoop ceramic matrix composite components, in accordance with the present disclosure, may be used as compressor blade tracks, combustion liners, exhaust system heat shields, or in other areas of a gas turbine engine.

Figure 5:
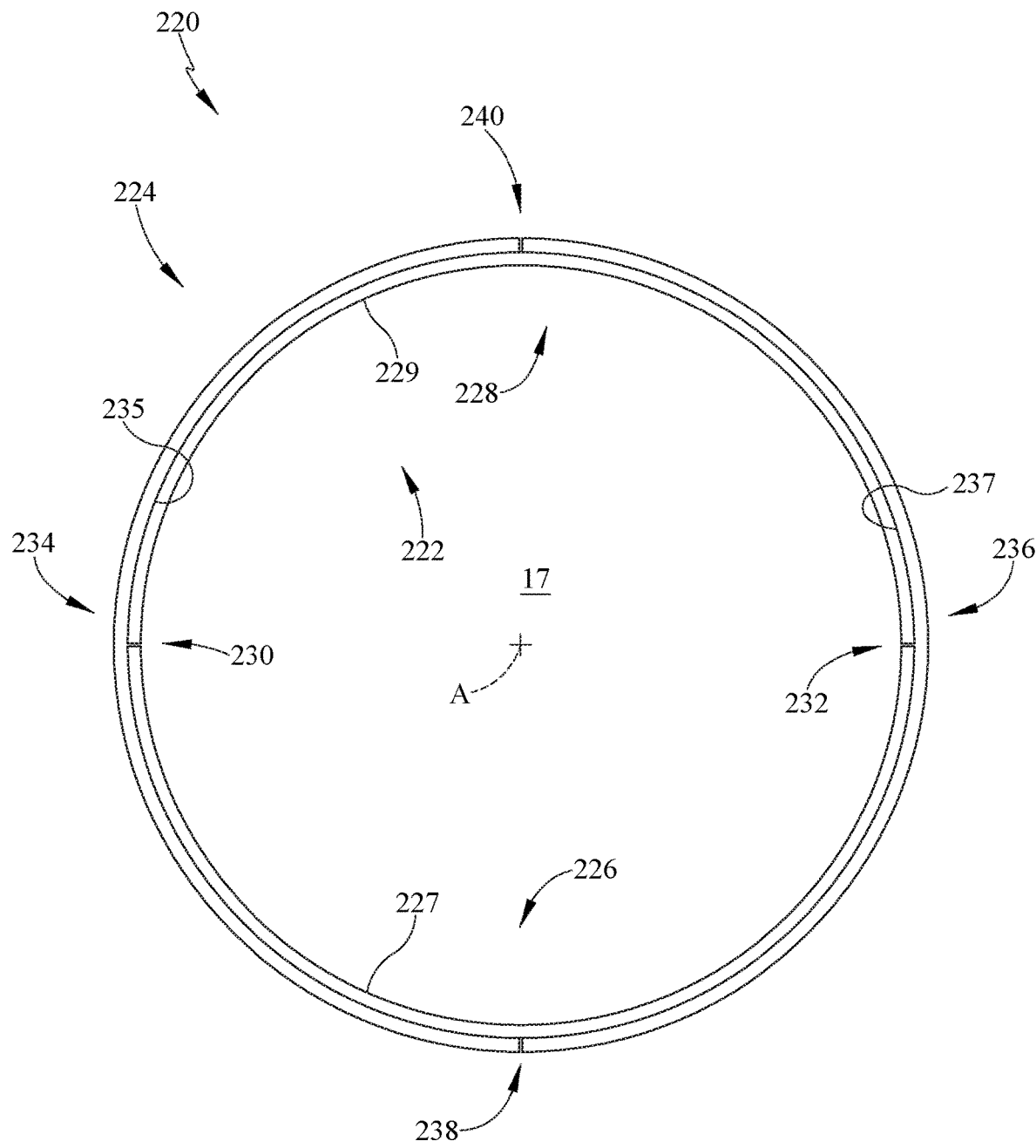
FIG. 5 is a front elevation view of a second embodiment of a blade track for use in a gas turbine engine showing that the second blade track includes a plurality of layers that extend circumferentially around a turbine and overlap to form a continuous full-hoop blade track.

Another embodiment of a full hoop blade track 220, according to the present disclosure, is shown in FIG. 5. Blade track 220 is made from ceramic matrix composite materials, such as, for example, silicon-carbide fibers suspended in a silicon-carbide matrix. Blade track 220 includes an inner layer 222 and an outer layer 224. Inner layer 222 arranged radially inward from outer layer 224 and faces flow path 17. Outer layer 224 is arranged radially outward from inner layer 222.

Inner layer 222 includes a first strip 226 and a second strip 228. First strip 226 and second strip 228 each extend partway around central axis A and interface at a first butt-joint 230 and a second butt-joint 232. Illustratively, first butt-joint 230 is spaced 180 degrees circumferentially from second butt joint 232.

Outer layer 224 includes a first strip 234 and a second strip 236. First strip 234 and second strip 236 each extend partway around central axis A and interface at a first butt-joint 238 and a second butt-joint 240. Illustratively, first butt-joint 238 is spaced 180 degrees circumferentially from second butt joint 240. However, other amounts of offset are possible.

First strip 234 of outer layer 224 is spaced radially outward from and extends circumferentially over first butt-joint 230 of inner layer 222. Second strip 236 of outer layer 224 is spaced radially outward from and extends circumferentially over second butt-joint 232 of inner layer 222. As such, first butt-joint 230 and second butt-joint 232 of inner layer 222 do not cooperate in a joint that extends radially though blade track 220 so that inner layer 222 and outer layer 224 form a continuous full hoop.

First strip 226 of inner layer 222 is spaced radially inward from and extends circumferentially under first butt-joint 238 of outer layer 224. Second strip 228 of inner layer 222 is spaced radially inward from and extends circumferentially under second butt-joint 240 of outer layer 224. As such, first butt-joint 238 and second butt-joint 240 of outer layer 224 do not cooperate in a joint that extends radially though blade track 220 so that inner layer 222 and outer layer 224 form a continuous full hoop.

Illustratively, inner layer 222 and outer layer 224 have a radial thickness that is about half of a radial thickness of blade track 220. In other embodiments, more layers may be included. Additionally, while inner layer 222 and outer layer 224 each include two strips that interface at two butt-joints, any number of strips and butt-joints may be included in inner layer 222 and outer layer 224. As such any number of strips and butt-joints may be used to form full hoop blade track 220.

Another aspect of the present disclosure involves a method of making blade track 220. The method of making blade track 220 comprises providing a first strip 226 and a second strip 228 of an inner layer 222 having a first curvature. First strip 226 and second strip 228 are positioned so that a concave surface 227 of first strip 226 faces a concave surface 229 of second strip 228. First strip 226 and second strip 228 interface at both ends to form a first butt-joint 230 and a second butt-joint 232 opposite the first butt-joint 230.

The method further comprises providing a first strip 234 and a second strip 236 of an outer layer 224 having a second curvature. First strip 234 is positioned so that a concave surface 235 of first strip 234 faces and extends circumferentially over the first butt-joint 230 of inner layer 222. Second strip 236 is positioned so that a concave surface 237 of second strip 236 faces and extends circumferentially over the second butt-joint 232 of inner layer 222. The first curvature may be smaller than the second curvature to allow inner layer 222 to be arranged radially inward from outer layer 224.

Butt-joints 230 and 232 may be spaced 180 degrees circumferentially from each other. Butt-joints 238 and 240 may be spaced 180 degrees circumferentially from each other. Inner layer 222 and outer layer 224 may be aligned so that each butt-joint 230, 232, 238, 240 are spaced 90 degrees circumferentially from one another. Butt-joints 230, 232 are positioned so that they do not align radially through blade track 220.

However, the number of strips used in inner layer 222 and outer layer 224 may affect the spacing between adjacent butt-joints. It is within the scope of this disclosure to use any suitable number of strips for both inner layer 222 and outer layer 224. As such, any suitable spacing between adjacent butt-joints are contemplated herein.

The method further comprises melt infiltrating the inner layer 222 and the outer layer 224 together to form blade track 220 as a full hoop extending circumferentially around central axis A. However, another aspect of the present disclosure involves using strips with arc-lengths that do not form a full hoop. In this situation, the strips may be pressed prior to being melt infiltrated so that the curvature of the strips is decreased and a full hoop is formed during the melt infiltration.

In illustrative embodiments, a blade track may have two main functions. One may be to form the outer annulus of the flow path while minimizing the clearance from the blade tips. This may prevent the hot flow path gases from bypassing the blade and allowing the turbine to extract work. The second function may be to seal and separate the secondary (cooling) air system to the flow path gases. This may be accomplished by using a number of blade tracks (seal segments) to form a full ring around the rotor and attaching these segmented blade tracks to the casing. There may be a number of small strip seals, bird mouth seals, etc. used in creating the seal between air systems.

In illustrative embodiments, the ceramic matrix composite (CMC) full hoop blade track may accomplish both of these functions in a different embodiment. A single piece, full hoop, CMC, blade track embodied here has a simple cross section that is cross keyed into the case. The single piece may eliminate all the intersegment gaps in the typical configuration therefore may eliminate potential leakage paths between the secondary air system and the hot flow path gases. This may also reduce the number of sealing components over the typical metallic configuration. The CMC lends itself to this configuration since it may not require the cooling air of a typical metallic component. Additionally, the lower coefficient of thermal expansion (CTE) of the CMC may be used to better match the rotor growth between specific conditions (namely cruise and max take-off). In this way it may control to the tip clearance of the blades.

In illustrative embodiments, the problem addressed may be the issue of scaling the hoop to the size of larger engine applications. The size of hoop that would go into many engines may be large when compared to typical manufacturing equipment and is a challenge to manufacture. The CMC manufacturing process may limit the size of the components. The different steps in the manufacturing process may have different limits. The present disclosure may disclose a way to make a single hoop by joining smaller arc segments with different joint geometries within the current manufacturing process and its limitations. The smaller arc segments may be at least partially densified by chemical vapor infiltration. Then the arc segments may be tooled together and the full hoop component then fully densified. The joining may be done with typical manufacturing methods (SMI).

In illustrative embodiments, each arc segment may have a protruding tongue at the circumferential ends. This extension may be machined from a constant thickness preform or could be layed up as shown so machining of the arc segment is not required. A joint would be completed by a wrap laminate that could capture both tongue/extensions from adjacent arc segments. This wrap may be made from a braided fiber architecture or made from wrapping a single ply around and around until the desired thickness is reached. This may minimize the steps between the arc segments and the wrap laminate along the inner diameter and outer diameter. The advantage of this joint may be that at any radial plane around the hoop there are continuous fibers spanning the joints.

In illustrative embodiments, the blade track may be formed from multiple half thickness sub-laminates such that the joints between the inner arc segments are staggered from the joints of the outer arc segments. An additional joint gap may be created in this configuration between the radially outer surface of the inner arc segments and the radial inner surface of the outer arc segments. This may be similar to a lap joint but may have a longer overlap.

In illustrative embodiments, the inner and outer hoops may be made from two arc segments, but it is reasonable to see how this can be made with a higher number of shorter arc segments as long as the inner and outer joint locations are staggered around the hoop. A potential advantage of this joint may be that at any radial plane around the hoop there are continuous fibers spanning the joints and the circumferential butt joints have a large spacing between them.

While the disclosure has been illustrated and described in detail in the foregoing drawings and description, the same is to be considered as exemplary and not restrictive in character, it being understood that only illustrative embodiments thereof have been shown and described and that all changes and modifications that come within the spirit of the disclosure are desired to be protected.

What is claimed is:

1. A full hoop blade track for a gas turbine engine, the blade track comprising
   a first segment comprising ceramic-matrix composite materials, the first segment including a band shaped to extend part-way around a central axis and an attachment tongue that extends about the central axis from a circumferential end of the band of the first segment,
   a second segment comprising ceramic-matrix composite materials, the second segment including a band shaped to extend part-way around the central axis and an attachment tongue that extends about the central axis from a circumferential end of the band of the second segment, and
   a joint that couples the first segment to the second segment, the joint including a tube of reinforcement fibers that receives the attachment tongues of the first segment and the second segment, wherein the tube of reinforcement fibers is co-infiltrated with ceramic-containing matrix material along with the first segment and the second segment in order to couple the first segment to the second segment,
   wherein the tube of reinforcement fibers has a radially-inner surface that is coextensive or flush with a radially-inner surface of the first segment and a radially-inner surface of the second segment.

2. The blade track of claim 1, wherein the tube of reinforcement fibers is woven or braided such that the tube of reinforcement fibers lacks a seam that extends circumferentially along the blade track.

3. The blade track of claim 2, wherein the tube of reinforcement fibers includes ceramic-containing fibers such that the co-infiltrated tube of reinforcement fibers is part of a ceramic matrix composite component.

4. The blade track of claim 1, wherein the attachment tongue of the first segment and the attachment tongue of the second segment each have a circumferential cross-sectional shape smaller than the circumferential cross-sectional shape of the band included in each of the first segment and the second segment.

5. The blade track of claim 4, wherein the edges of the attachment tongues included in the first and the second segments are spaced radially and axially apart from the edges of the bands included in the first and the second segments when viewed in the circumferential direction.

6. The blade track of claim 1, wherein the first segment includes a second attachment tongue that extends about the central axis from another circumferential end of the band of the first segment, the second attachment tongue adapted to be received in another tube of reinforcement fibers so as to create a second joint.

7. A gas turbine engine assembly, comprising
   a first segment comprising ceramic-matrix composite materials, the first segment including a main body and an attachment tongue that extends from an end of the main body of the first segment,
   a second segment comprising ceramic-matrix composite materials, the second segment including a main body and an attachment tongue that extends from an end of the main body of the second segment, and
   a joint that couples the first segment to the second segment, the joint including a tube of reinforcement fibers that receives the attachment tongues of the first segment and the second segment, wherein the tube of reinforcement fibers is fixed with the attachment tongue of the first segment and the attachment tongue of the second segment, and wherein the main body of the first segment, the main body of the second segment, and the tube of reinforcement fibers define a portion of a flow path configured to be exposed to flow path gases,
   wherein the tube reinforcement fibers has a radially-inner surface that is coextensive or flush with a radially-inner surface of the first segment and a radially-inner surface of the second segment.

8. The gas turbine engine of claim 7, wherein the tube of reinforcement fibers is woven or braided such that the tube of reinforcement fibers lacks a seam.

9. The gas turbine engine of claim 7, wherein the tube of reinforcement fibers includes ceramic-containing fibers such that the tube of reinforcement fibers is part of a ceramic matrix composite component.

10. The gas turbine engine of claim 7, wherein the attachment tongue of the first segment and the attachment tongue of the second segment each have a circumferential cross-sectional shape smaller than a circumferential cross-sectional shape of the main body included in each of the first segment and the second segment.

11. The gas turbine engine of claim 10, wherein edges of the attachment tongues included in the first and the second segments are spaced radially and axially apart from edges of the main bodies included in the first and the second segments when viewed in the circumferential direction.

12. The gas turbine engine of claim 7, wherein the first segment includes a second attachment tongue that extends about a central axis from another end of the main body, the second attachment tongue is adapted to be received in another tube of reinforcement fibers so as to create a second joint.

13. The gas turbine engine of claim 7, wherein the attachment tongue of the first segment and the attachment tongue of the second segment each extend circumferentially from a respective attachment surface of the main body included in each of the respective first segment and the respective second segment, the attachment surface of the first segment and the attachment surface of the second segment face the joint when the attachment tongue of the first segment and the attachment tongue of the second segment are received within the tube, and edges of each attachment tongue included in the first segment and the second segment are spaced apart radially from edges of the main body included in each of the first segment and the second segment when viewed in the circumferential direction.

14. The gas turbine engine of claim 13, wherein the edges of each attachment tongue included in the first segment and the second segment are spaced apart axially from the edges of the main body included in each of the first segment and the second segment when viewed in the circumferential direction.

15. A method of making a full hoop blade track for a gas turbine engine, the method comprising:

chemical vapor infiltrating ceramic material preforms with silicon-carbide fibers, the preforms including a first blade track segment having a first band and a first tongue, a second blade track segment having a second band and a second tongue, and a joint having a tube of reinforcement fibers, assembling the full hoop blade track by inserting the first tongue formed on the first segment into a first end of the tube of reinforcement fibers and inserting the second tongue formed on the second segment into a second end of the tube of reinforcement fibers, aligning a radially-inner surface of the first segment with a radially-inner surface of the joint and aligning a radially-inner surface of the second segment with the radially-inner surface of the joint so that the radially-inner surface of the joint is coextensive or flush with the radially-inner surface of the first segment and the radially-inner surface of the second segment, and slurry infiltrating and melt infiltrating the first segment, the second segment, and the joint to bond the first segment, the second segment, and the joint together so that each of the first segment, the second segment, and the joint each form a portion of a radially-inward facing surface of the full hoop blade track.

\* \* \* \* \*